United States Patent [19]

Sattin

[11] Patent Number: 4,884,029
[45] Date of Patent: Nov. 28, 1989

[54] QUICK IMAGING SCHEME UTILIZING DIFFERENTLY PHASE ENCODED PRIMARY AND STIMULATED ECHOES

[75] Inventor: William Sattin, Cleveland Hts., Ohio

[73] Assignee: Picker International, Inc., Highland Hts., Ohio

[21] Appl. No.: 243,294

[22] Filed: Sep. 12, 1988

Related U.S. Application Data

[63] Continuation-in-part of Ser. No. 897,118, Aug. 15, 1986, Pat. No. 4,774,466.

[51] Int. Cl.⁴ .............................................. G01R 33/20
[52] U.S. Cl. ...................................... 324/309; 324/312
[58] Field of Search ........................ 324/307, 309, 312

[56] References Cited

U.S. PATENT DOCUMENTS

| | | | |
|---|---|---|---|
| 4,502,007 | 2/1985 | Mee et al. | 324/307 |
| 4,684,892 | 5/1987 | Graumann | 324/309 |
| 4,748,409 | 5/1988 | Frahm et al. | 324/309 |
| 4,774,466 | 9/1988 | Sattin | 324/309 |

*Primary Examiner*—Stewart J. Levy
*Assistant Examiner*—Kevin D. O'Shea
*Attorney, Agent, or Firm*—Fay, Sharpe, Beall, Fagan, Minnich & McKee

[57] ABSTRACT

A magnetic resonance excitation pulse (50, 150, 250) is applied to excite resonance in selected dipoles in an examination region. A second radio frequency pulse (60, 160, 260) induces a primary echo which is phase encoded by a phase encode gradient (56, 156, 256) with a first phase encode angle. Optionally, an additional phase encode gradient (356) may be applied after the primary echo to remove the first phase encoding. A third radio frequency pulse (70, 170, 270) rotates the magnetization, typically 90°, to cause a stimulated echo (72, 172, 272) which is phase encoded in accordance with a second phase encode gradient (78, 178, 278). Optionally, another phase encode gradient pulse (378) may be applied after the stimulated echo to remove the second phase encoding. In the preferred embodiment, the first phase encoding is varied in steps from central phase encoding to a first preselected maximum phase encoding and the second phase encoding varies from about the central phase encoding to a second maximum of about the same magnitude as the first maximum but of the opposite polarity. In this manner, an interface between primary and secondary echo data is defined adjacent the central phase encode angle. The primary and stimulated echo data are corrected for discontinuities and reconstructed into an image representation. Redundant primary and stimulated echo data are collected adjacent the interface for comparison during the alignment.

13 Claims, 5 Drawing Sheets

QUICK IMAGING SCHEME UTILIZING DIFFERENTLY PHASE ENCODED PRIMARY AND STIMULATED ECHOES

This application is a continuation-in-part of U.S. application Ser. No. 897,118, filed Aug. 15, 1986, now U.S. Pat. No. 4,774,466.

BACKGROUND OF THE INVENTION

The present invention relates to the art of magnetic resonance spectroscopy. It finds particular application in conjunction with imaging body tissue in selected planar regions with primary stimulated imaging sequences and will be described with particular reference thereto. However, it is to be appreciated that the present invention is also applicable to imaging and analyzing of selected regions of animate and inanimate objects with field echo, spin echo, and other imaging sequences.

Heretofore, various imaging sequences have been utilized in medical diagnostic and other magnetic resonance imaging, e.g. spin echo sequences. A common imaging sequence included applying a 90° radio frequency excitation pulse to induce magnetic resonance in selected dipoles in an image region. A phase encoding gradient pulse was applied to encode the resonating dipoles with a selected phase angle. A magnetization rotation pulse, commonly a 180. inversion pulse, induced magnetization vectors of the resonating dipoles to converge toward a spin echo. Imaging data was then collected during the induced echo. To generate a 256 view image, the sequence was repeated 256 times, each time with a different phase angle encoding.

For some examinations, it was advantageous to generate image which were dominated by data attributable to the longer T1 relaxation times rather than shorter T2 relaxation times. In one technique for generating T1 rather than T2 weighted image, a 90° excitation pulse was followed by two 90° magnetization rotation pulses. A phase encode gradient was applied either between the excitation pulse and the second 90° pulse or between the third 90° pulse and an induced stimulated echo. The phase encode gradient caused the magnetic resonance data collected during the stimulated echo to have an appropriate phase angle encoding. To generate an image with 256 views, the sequence was repeated 256 times, each time with a different phase angle encoding gradient. Optionally, appropriate magnetization vector rotation pulses of an appropriate rotational angle were applied to cause additional stimulated echoes in the same sequence. By applying an additional phase encode gradient pulse after each magnetization vector rotation pulse, the phase encoding of the successive stimulated echoes could be altered. See for example, "Rapid Images and NMR Movies" A. Haase, et al., SMRM Abstracts, pages 980-981 (1985).

Various techniques were also developed for accelerating the data collection time for T2 weighted images. Typically information regarding more than one view was acquired during the sequence following each excitation. As one example, this was achieved by utilizing a Carr-Purcell sequence in which an appropriate phase encode gradient was applied adjacent each inversion pulse to alter the phase encoding of the following spin echo. For example, a 90° magnetic resonance excitation pulse was applied to excite magnetic resonance. A phase encoding gradient was applied followed by a 180° inversion pulse to induce a first spin echo. After collecting data during the first spin echo, another phase encoding pulse was applied to alter the phase encoding and a second 180° inversion pulse was applied to cause a second spin echo with the different phase encoding. The changing of the phase encoding and the application of an additional 180° inversion pulse was repeated a plurality of times following a single, initial excitation. See for example, "Phase-Encoded, Rapid Multiple-Echo (PERME) Imaging" M. Lawson, et al., SMRM Abstracts, pages 1009-1010 (1985).

One of the drawbacks to the multiple echo Carr-Purcell techniques was that the signal intensity varied greatly from echo to echo. Commonly, the T2 relaxation times in the body are short compared to the interval between inversion pulses in the multiple echo Carr-Purcell sequence. This variation caused the signal intensity to vary significantly from echo to echo, which greatly degraded image quality.

The present invention provides a new and improved magnetic resonance sequence which provides a unique and selectable weighting between T1 and T2 to overcome the above referenced problems and others.

SUMMARY OF THE INVENTION

In accordance with one aspect of the present invention, a magnetic resonance technique is provided. Two phase encoding gradients are applied during the sequence in such a manner that the magnetization components that cause primary and stimulated echoes are encoded with different phase encode angles. In this manner, data representing two differently phase encoded views can be collected following a single excitation. For example, only 128 repetitions of the sequence can generate 256 unique views.

In accordance with a more limited aspect of the invention, redundant views are collected adjacent a central or other interface(s) between the early and late echo data. The redundant data is compared and at least one of the data sets is adjusted in accordance with the comparison.

In accordance with another aspect of the present invention, a magnetic resonance apparatus is provided which implements the above referenced technique.

One advantage of the present invention is that it enables two or more differently phase encoded views to be taken after each resonance excitation.

Another advantage of the present invention is that the relative T1 and T2 weighting of the views is selectable.

Another advantage of the present invention is that it provides improved image quality including good image contrast, freedom from perturbation of data about the zero phase encode view, freedom from T2 related interview artifacts, improved slice definition, and the like.

One more advantage of the present invention is that it enables the use of reduced amplitude phase encoding gradients.

Yet another advantage resides in reduced transmission power requirements attributable to the use of 90° rather than 180° RF pulses.

Still further advantages of the present invention will become apparent to those of ordinary skill in the art upon reading and understanding the following detailed description.

BRIEF DESCRIPTION OF THE DRAWINGS

The invention may take form in various steps and arrangements of steps or in various components and arrangements of components. The drawings are only for purposes of illustrating a preferred embodiment and are not to be construed as limiting the invention.

DETAILED DESCRIPTION OF THE PREFERRED EMBODIMENT

Figure 1A:
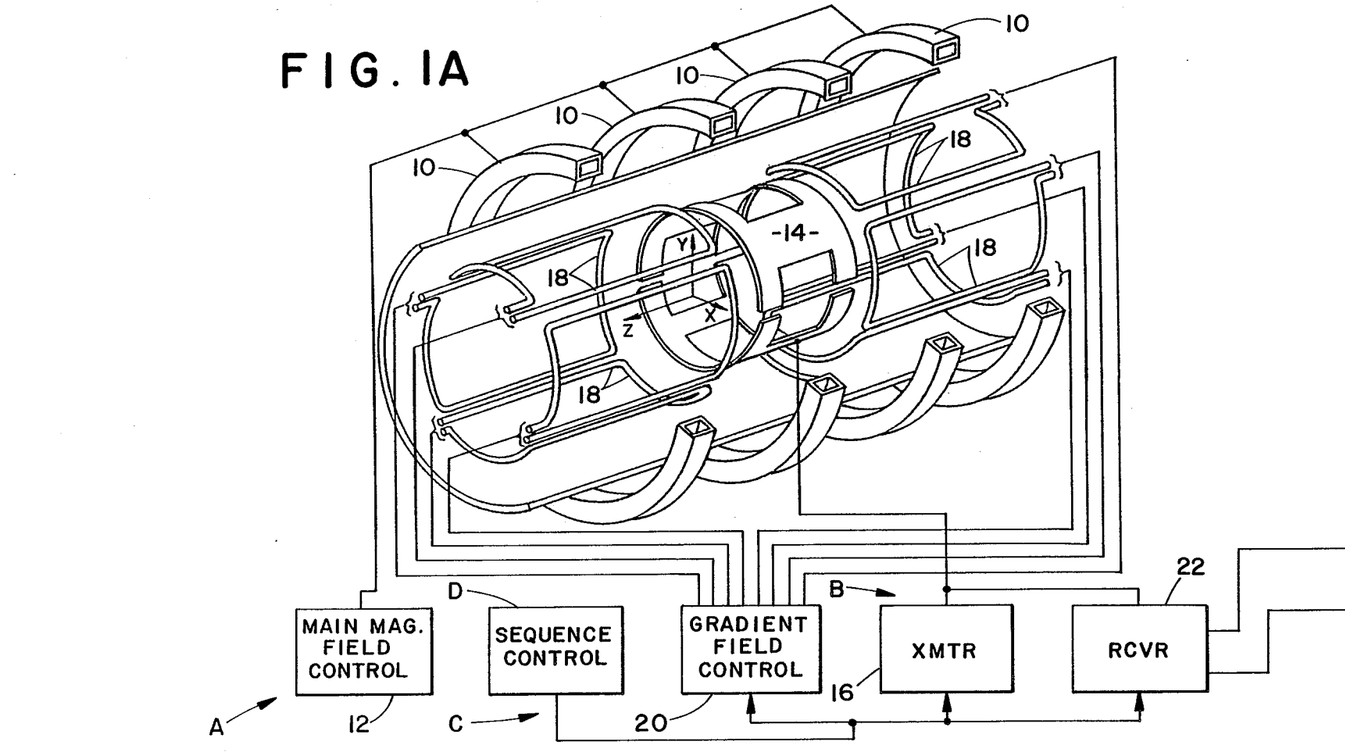
FIGS. 1A and 1B are a diagrammatic illustration of a magnetic resonance imaging apparatus for implementing the present invention.
Figure 1B:
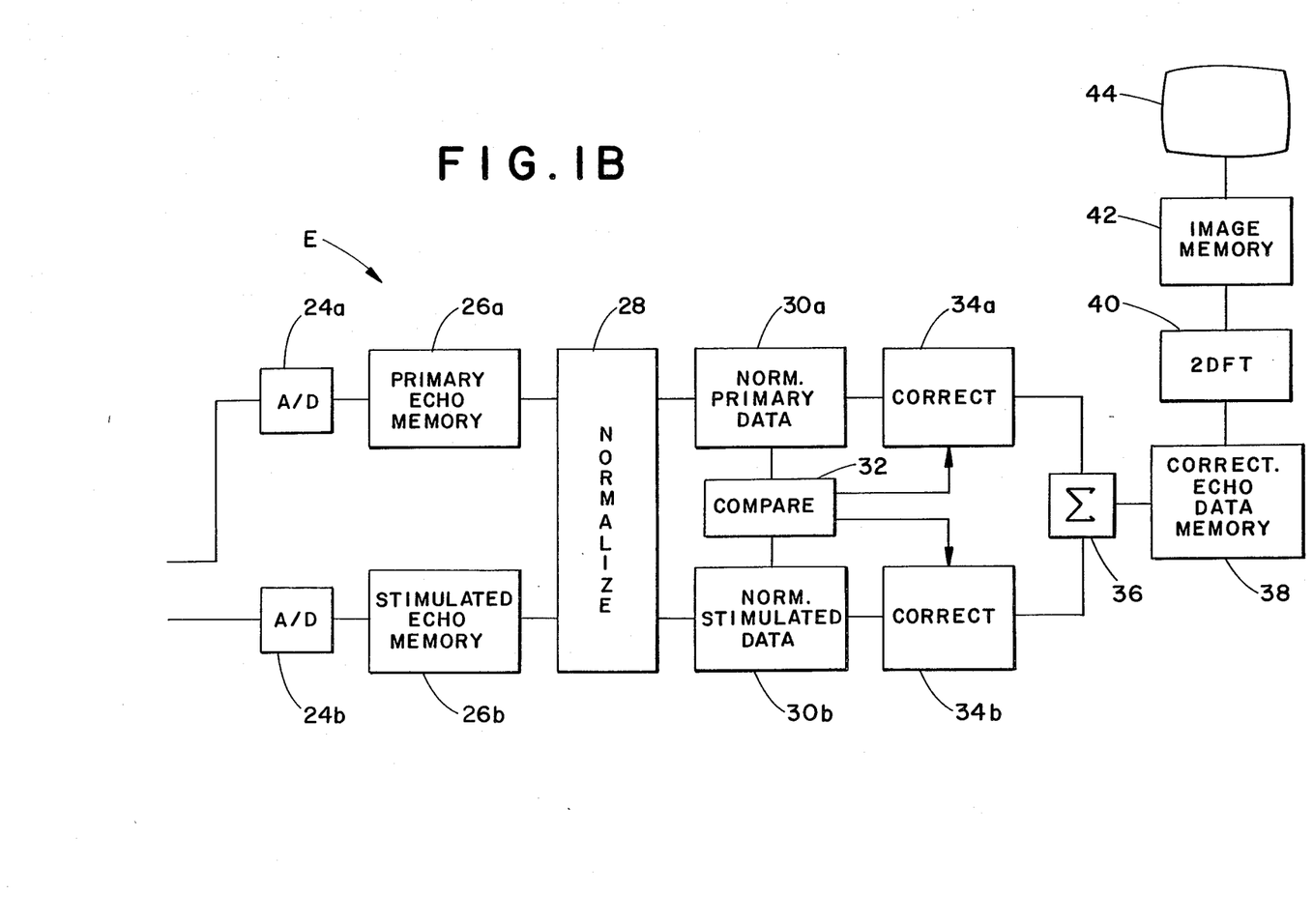

With reference to FIGS. 1A and 1B, a magnetic resonance imaging apparatus includes a main magnetic field means A for generating a substantially uniform magnetic field through an image region. A radio frequency means B selectively transmits radio frequency excitation pulses for generating magnetic resonance of the magnetization of selected dipoles within the image region. Further, the radio frequency means transmits radio frequency magnetization rotation pulses for selectively rotating selected components of the magnetization through 90°, 180°, or other selected angles. A gradient field means C selectively applies gradient fields, preferably along three orthogonal axes across the image region. A pulse sequence control means D controls the radio frequency means and the gradient means to cause the generation of preselected pulse sequences in accordance with FIGS. 2–7. An image means E processes received magnetic resonance signals and reconstructs an electronic image representation for electronic storage, display on a video monitor, or the like.

The magnetic field means A includes a control circuit 10 and a plurality of superconducting or resistance magnets 12. The control circuit causes the magnets to generate a substantially uniform magnetic field axially therethrough, particularly in a centrally located image or examination region.

The radio frequency means B includes a radio frequency coil 14, such as a quadrature coil which surrounds the examination region. A radio frequency (RF) transmitter 16 selectively applies radio frequency pulses to the RF coil 14 to excite and manipulate magnetic resonance of selected dipoles in the examination region. A typical resonance excitation pulse is a 90° pulse, i.e. a pulse which rotates magnetization vector components of the selected dipoles through an angle of 90°. Subsequent 90° pulses, 180° inversion pulses, and other angle pulses selectively cause components of the magnetization of the precessing dipoles to be further rotated through 90°, 180°, or other selected angles. When a single stimulated echo is generated, the magnetization is twice rotated through 90° after the initial 90° excitation RF pulse. If multiple stimulated echoes are to be generated, then the angles of rotation are adjusted, as is known in the art, to maintain uniformity from echo to echo of the RF pulse tip angle dependence of the magnetization component causing the stimulated echo. Optionally, pulses of other configurations for making other selected manipulations of the magnetization may be generated.

The gradient means C includes gradient coils 18 for causing gradients across the main magnetic field in the examination region at selectable angles. In the preferred embodiment, the gradients are selectively caused along three orthogonal axes designated as the slice select, read, and phase encode axes or directions.

A gradient field control means 20 includes a first axis or slice selection gradient control means or circuit selectively applies electrical power to appropriate windings of the gradient coil assembly to select one of a multiplicity of slices or planes in the examination region to be phase mapped. Commonly, the slice is selected by applying a linear field gradient along the central or z-axis of the image region and applying a narrow band excitation pulse to excite spins over a limited range of resonance frequencies. A second axis or read gradient control selectively applies along a read gradient across the examination region in along a y-axis or read gradient direction. A third gradient or phase encode gradient control circuit or means selectively applies phase encode gradients along an x-axis or phase encode direction at selected amplitudes for encoding the resonance signal with selected phase angles. When 256 views are reconstructed into each image, gradients to encode a different one of 256 phase angles are successively applied. In this manner, the resonance data collected from the primary echo and the stimulated echo following each of 128 resonance excitations causes 256 views of data, each encoded with a different phase angle.

The received magnetic resonance data is received by a radio frequency receiver 22. The first or primary echo data is digitized by a first analog-to-digital converter 24a and stored in a first or primary echo memory means 26a. Analogously, the second or stimulated echo data is digitized by a second analog-to-digital converter 24b and stored in a second or stimulated echo memory 26b.

A normalizing means 28 normalizes the amplitudes of the primary and stimulated echo data, if necessary. The magnitudes may be adjusted by taking the square root of the real and imaginary parts of the data values with common or overlapping phase encode angles. That is, a limited number of data samplings may be taken in which both the primary and stimulated echoes are phase encoded with the same angle. Whatever normalization is required to bring the magnitude of the overlapping lines into conformity, the same normalization adjustment is made to the remaining data in one or both of the primary and stimulated echo data sets. The normalized data are stored in normalized primary and stimulated echo memory means 30a, 30b, respectively.

Although, ideally, the primary and stimulated echo data will match precisely, system non-linearities, eddy currents, and the like may cause discontinuities or errors between the primary and stimulated echo data. To this end, a comparing means 32 compares the primary and stimulated echo data. Various comparisons may be made. For example, the phase of redundant primary and stimulated echo data lines may be compared and an appropriate phase adjustment or rotation made to one or both of the data sets. The comparing means 32 may also compare regions or portions of the data from redundant data lines and make different adjustments for different regions. A correcting means 34a under control of the comparing means 32 makes the appropriate phase angle or other corrections to the normalized primary echo data. Analogously or alternately, a second correcting means 34b may correct the normalized stimulated echo data.

A combining means 36 combines the normalized and corrected primary and stimulated echo data and stores it in a corrected echo data memory means 38. The combining means may average the redundant data lines, if any, of the primary and stimulated echo data.

An image reconstruction means 40 implements a two dimensional inverse Fourier transform or other algorithm as is known in the art to reconstruct the corrected echo data from memory means 38 into an image representation for storage in an image memory means 42. The image representation may be displayed on a video monitor 44, subject to further processing, stored on tape or disk, or the like.

Figure 2:
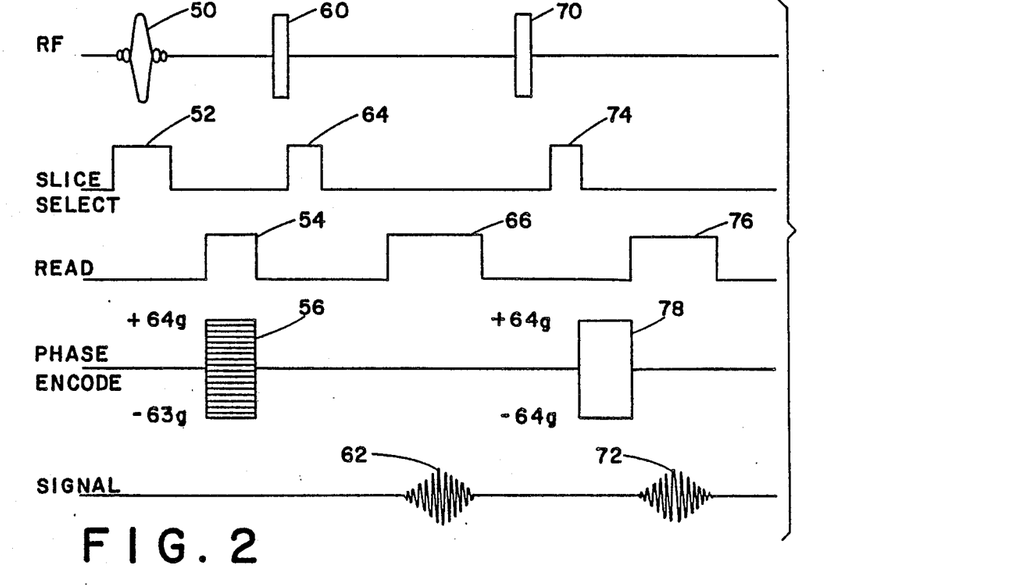
FIG. 2 illustrates a magnetic resonance sequence in which the phase encoding is altered between primary and stimulated echoes.

With continuing reference to FIGS. 1A and 1B and further reference to FIG. 2, the pulse sequence control means D coordinates the application of the radio frequency, slice select gradient, read gradient, and phase encode gradient pulses in such a manner that a primary echo encoded with a first phase encode angle and a stimulated echo encoded with a second phase encode angle is generated after each resonance excitation. The imaging sequence control means D causes the RF transmitter 16 to apply a first RF pulse 50 to excite resonance, specifically a 90° RF pulse. The gradient field control 20 is concurrently caused to apply a slice select gradient 52. Second, the imaging sequence control means causes the gradient control means 20 to apply a read gradient pulse 54 and phase encode gradient pulse 56. In successive iterations of the sequence, the phase encode gradient is applied in incremental steps g, each incremental step representing a corresponding incremental shift in the encoded phase encode angle. The low angle phase encode gradients, i.e. those closest to a 0° phase encode angle, contribute low spatial frequency information, i.e. coarse resolution, and are primarily responsible for the image signal-to-noise, i.e. contrast. Views with the larger or higher phase encode angles at both positive and negative extremes, contribute the high spatial frequency information, i.e. the fine detail of the resultant image. The greater phase encoded views contribute little to the overall image signal-to-noise. In the embodiment of FIG. 2, the first phase encode gradient 56 ranges from −63g to +64g such that it can encode 128 phase encode angles, particularly the 128 smallest phase encode angles.

The image sequence control means D next causes the RF transmitter means 22 to generate a second RF pulse 60, particularly a 90° pulse, which rotates magnetization vector components by 90°. The second RF pulse (i) causes first magnetization vector components to begin converging toward a primary echo 62 and (ii) causes additional or second components of the magnetization to be rotated 90° to a direction which is unaffected by phase encoding gradients. A slice select gradient pulse 64 and a read gradient pulse 66 are applied to control which resonating dipoles in the image region contribute to the sampled data. Primary echo magnetic resonance data is collected during the read gradient 66 to generate one view for reconstruction into an image representation by the image means E.

The image sequence control means D causes the RF transmitter means 22 to apply a third RF pulse 70. In the illustrated embodiment in which only a single stimulated echo is generated, the third RF pulse 70 is another third 90° pulse when maximum stimulated echo signal intensity is desired. The third RF pulse rotates the second magnetization components 90° back along an axis in which they are affected by the phase encode gradients. The second magnetization rotation pulse also rotates a portion of the first magnetization components along the axis or direction which is unaffected by the phase encode gradients and in which they do not produce parasitic echoes or other signals which interfere with a stimulated echo 72 generated by the converging second magnetization components. The image sequence control means causes the gradient control means 20 to generate a slice select gradient pulse 74 and the read gradient control means 34 to generate a third read gradient 76 concurrently with the stimulated echo.

The first phase encode gradient 56 was applied before the second magnetization components were rotated along the unaffected direction. Accordingly, the second magnetization components, which are rotated back by the third RF pulse 70 to converge as the stimulated echo, are already phase encoded with the same first phase encode angle. If the primary and stimulated echoes had the same phase encoding, the information conveyed thereby would be redundant in the sense that the data from both would represent the data encoded with the same phase angle. A second phase encode gradient 78 is applied by the gradient control means 20 to alter the previous phase encoding. In the embodiment of FIG. 2, the second phase encode gradient adds a fixed offset phase encode angle. More specifically, the primary echo is encoded with the low phase encode angles and the stimulated echo with the high phase encode angles. The second phase encode gradient 78 adds an offset of +64g or −64g. The −64g offset is added to the magnetization components which were initially coded with a phase angle of 0 to −63g and the +64g offset gradient is applied to those of magnetization components which had initially been phase encoded with a phase angle of 1g through 64g. In this manner, the primary echo is encoded with phase encode angles of −63g to +64g as shown in region 80 of FIG. 2A. The stimulated echo is encoded with phase encode angles of −64g through −127g and +65g through +128g as shown in regions 82. To generate a 256 view image, the sequence is only repeated 128 times. Each time the first phase encode gradient encodes a different phase encode angle, the second phase encode gradient adds +64g or −64g. In this manner, 128 repetitions of the sequence generates 256 views each with a unique phase encoding. Two additional repetitions may be made to create redundant primary and stimulated echo views adjacent the +64/+65g interface and the −63/−64g interface.

The duration between the third RF pulse 70 and the second RF pulse 60 is minimized to maximize the T2 weighting of the stimulated echo 72. This causes the relative T1 and T2 weighting of the primary and stimulated echoes to be generally the same. Increasing the duration between the second and third RF pulses increases a T1 weighting which is unique to the stimulated echo.

Figure 3:
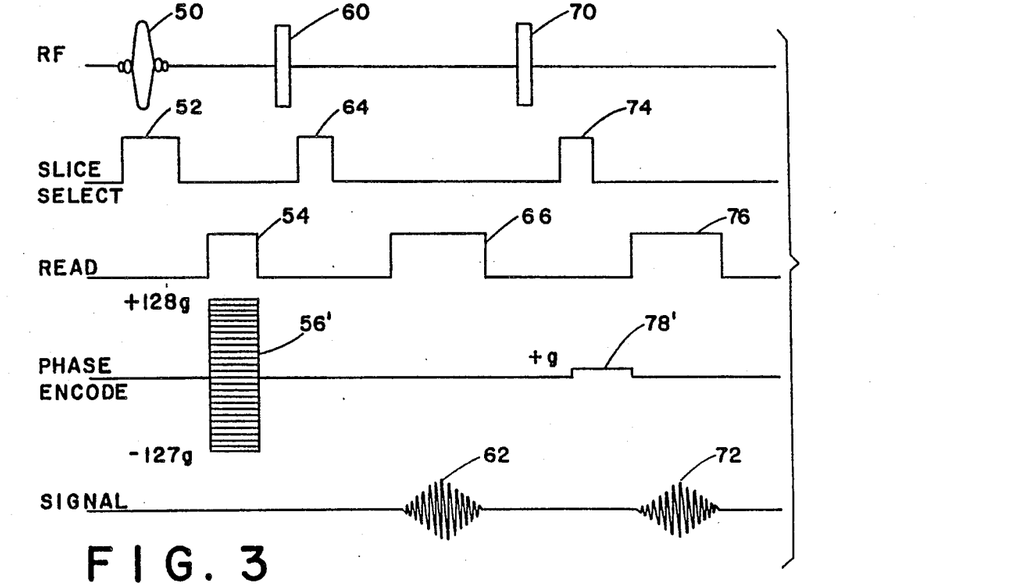
FIG. 3 illustrates an alternate embodiment of a magnetic resonance sequence of FIG. 2.

With reference to FIG. 3, it is to be appreciated that the phase angle encodings may be distributed in other ways between the primary and stimulated echoes. For example, the first phase encode gradient 56' may range in steps of 2g from $-127g$ to $+128g$. The second phase encode gradient 78' may have an amplitude g. In this manner, the primary echoes generate signals corresponding to odd numbered phase encode angles and the stimulated echo generates data corresponding to the intervening even numbered phase encode angles.

Figure 4:
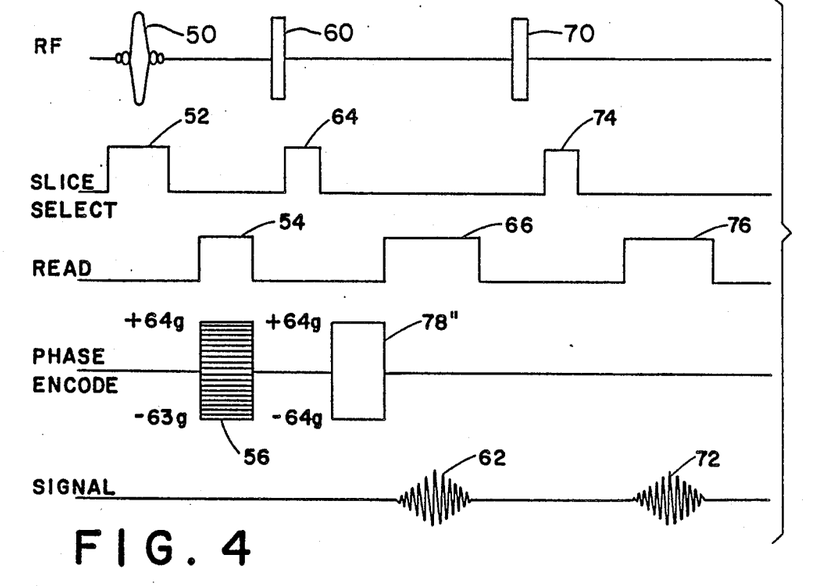
FIG. 4 illustrates another alternate embodiment of the magnetic resonance sequence.

In the embodiment of FIG. 4, the second phase encode gradient 78" is applied such that the phase encode angle of the primary rather than the stimulated echo is altered. More specifically, the radio frequency, slice select, and read gradient pulses are applied with the same timing as described above in conjunction with FIG. 2. The first phase encode gradient 56 is again applied between the first RF pulse 50 and the second RF pulse 60 such that both the first and second magnetization components are phase encoded with the same phase encode angle. In the FIG. 4 embodiment, the first phase encode gradient pulse again assumes one of 128 magnitudes ranging from $-63g$ to $+64g$ in steps of g. After the first magnetization rotation pulse 60 is applied and the second magnetization components are rotated along a direction in which they are unaffected by the application of further phase encode gradients, a second phase encode gradient pulse 78" is applied. IN the illustrated embodiment, the second phase encode gradient has a magnitude of $+64g$ when the first phase encode gradient has a magnitude of g through $+64g$ and $-64g$ when the first phase encode gradient has a magnitude of 0 through $-63g$.

Applying the second phase encode gradient after the second RF pulse 60 and before the primary echo data is collected twice phase encodes the primary echo. The primary echo 62 is thus phase encoded with the sum of the phase encode angles attributable to the first and second phase encode gradient pulses. When the third RF pulse 70 rotates the second magnetization components out of the unaffected direction, they are still phase encoded with the phase encode angle of the first gradient 56. In this manner, the stimulated echo contributes the contrast and the coarse resolution of region 80 of FIG. 2A to the resultant image and the primary echo contributes the fine detail resolution of regions 82.

It is to be appreciated that increasing the duration between the second and third RF pulses in the FIG. 3 embodiment will increase the T1 contribution in the stimulated echo hence to the contrast and coarse resolution of the resultant image. That is, the resultant image can be caused to have more the contrast and appearance of a stimulated echo T1 image by increasing the duration between the second and third RF pulses. In this manner, the relative T1/T2 weighting of the resultant image is selectable, in addition to the conventional means of controlling the T1/T2 weighting. With the primary echo contributing the high spatial frequency information and the primary echo having the greater signal intensity in this case compared to the T1 weighted stimulated echo, an edge enhancement phenomenon will occur.

Figure 5:
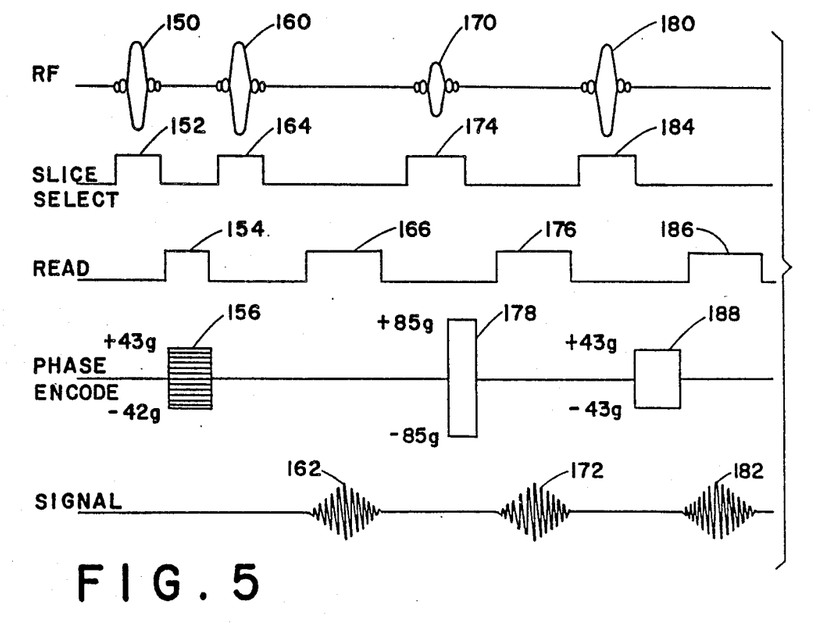
FIG. 5 illustrates yet another alternate embodiment of the magnetic resonance sequence, which alternate embodiment provides multiple echo and multiple slice data.

With reference to FIG. 5, the present invention is also applicable to multi-slice imaging and to imaging with multiple echoes. A first 90° RF pulse 150 and a first slice select pulse 152 are concurrently applied. Subsequently, a read gradient pulse 154 and a first phase encode gradient pulse 156 are applied. In the illustrated embodiment, the first phase encode gradient phase encodes the magnetization components with a selected one of central one third of the phase encode angles. In the 256 view image example, the first phase encode gradient successively applies gradients of $-42g$ through $+43g$ in increments of g. A second RF pulse 160, preferably a 90° pulse, is applied to rotate the magnetization components and cause a primary echo 162. A second slice select pulse 164 is applied contemporaneously with the second RF pulse 160 and a second read gradient 166 is applied concurrently with a primary echo 162. In this manner, the primary echo is phase encoded with the lowest spatial frequency third of phase angles illustrated in region 180 of FIG. 5A.

A third radio frequency pulse 170, preferably a 45° pulse is applied to cause a first stimulated echo 172. A third slice select gradient 174 is applied concurrently with the third RF pulse and a second read gradient 176 is applied concurrently with the first stimulated echo. A second phase encode gradient 178 with a fixed plus or minus magnitude is applied to increase the phase encode angle of the magnetization components contributing to a first stimulated echo 172. In the illustrated embodiment, the second phase encode gradient pulse has a magnitude of $+85g$ when the first phase encode gradient pulse is in the range of g to $+43g$ and a magnitude of $-85g$ when the first is in the range of 0 to $-42g$. In this manner, the data collected during the first stimulated echo 172 is encoded with the highest spatial frequency third of the phase encode angles, i.e. region 182 of FIG. 5A.

Thereafter, a fourth RF pulse 180 is applied concurrently with a fourth slice select gradient 184 to cause a second stimulated echo 182. A fourth read gradient 186 is applied concurrently with the second stimulated echo. A third phase encode gradient 188 has a preselected fixed amplitude to alter the phase encode angle of the magnetization components which form the second stimulated echo to a second or intermediate frequency third of the phase encode angles. The third phase encode gradient has an amplitude of $\pm 43g$. It is to be appreciated that the primary echo and the second stimulated echo each have views phase encoded at $-42g$ and at $+43g$. These two redundant views may be utilized by the normalizing means 28 and comparing means 32 to normalize and align the views. A larger number of redundant views may be created between regions 182 and 184 and one or a small plurality of redundant views may be created between regions 180 and 182 to facilitate aligning the primary and stimulated echo data. Alternately, these redundant views may be deleted.

Fifth and subsequent RF pulses with corresponding slice select, pulse encode, and read gradients may also be applied to generate fifth and subsequent stimulated echoes to expedite imaging still ore. The first stimulated echo data has a better signal to noise ratio than the second stimulated echo data. The illustrated embodiment utilizes the first or most noise-free stimulated echo data for the high phase encode angle or fine resolution views.

Figure 6:
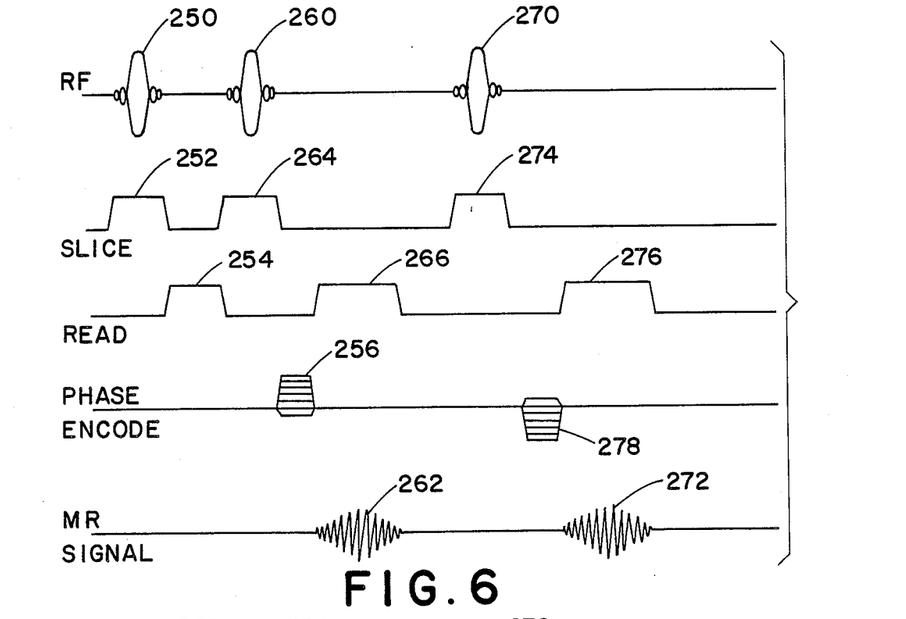
FIG. 6 illustrates an imaging sequence in which the primary and stimulated echoes are phase encoded independently.

With reference to FIG. 6, a first 90° pulse 250 is applied in the presence of a slice select gradient 252 followed by a read gradient 254. A phase encode gradient 256 follows a second 90° RF pulse 260 applied in the presence of a second slice select gradient 264 to rotate a first component of the magnetization vectors into the transverse plane. The first phase encode gradient assumes a selected one of a plurality of magnitude steps or levels between a central view and one maximum phase angle view. In the illustrated 256 view embodiment, the phase encode gradient assumes steps ranging from about −23g to +128g. A first or primary magnetic resonance packet 262 read in the presence of a read gradient 266 is phase encoded in accordance with the phase encode gradient.

A third 90° RF pulse 270 applied in the presence of a third slice select gradient pulse 274 rotates the magnetization vectors phase encoded by the first phase encode gradient 256 out of the transverse plane such that they do not contribute to a resultant magnetic resonance signal 272 and rotates second magnetization components into the transverse plane to undergo magnetic resonance precession. These second components are phase encoded with a second phase encode gradient 278 which is stepped between a central phase encode angle to an opposite maximum phase encode angle. In the illustrated embodiment, the phase encode gradient selectively assumes steps from +24g to 127g. The second magnetic resonance echo 272 is read in the presence of a read gradient 276.

In this manner, the first or primary echo 262 is phase encoded in accordance with the first phase encode gradient and the second or stimulated echo 272 is phase encoded in accordance with only the second phase encode gradient.

Figure 2A:
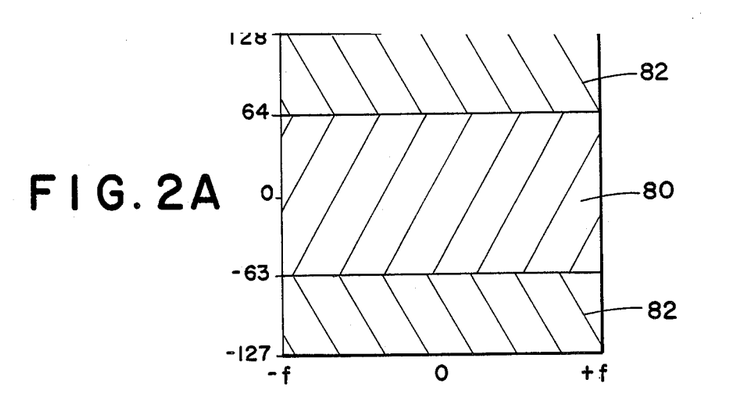
FIG. 2A is a graphic illustration of the primary and stimulated echo data sets collected with the sequence of FIG. 2.
Figure 5A:
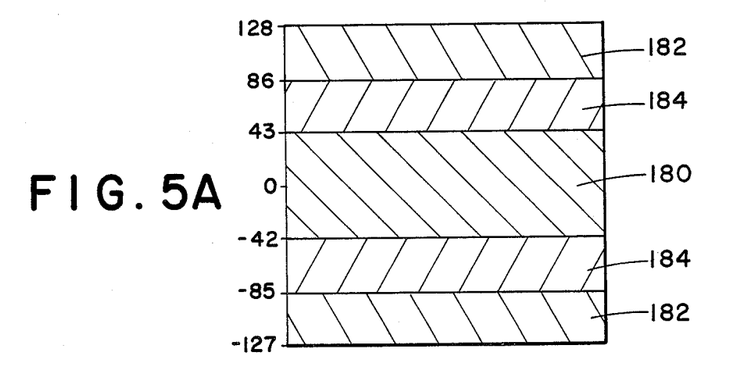
FIG. 5A is a graphic illustration of the primary and stimulated echo data sets collected with the sequence of FIG. 5.
Figure 6A:
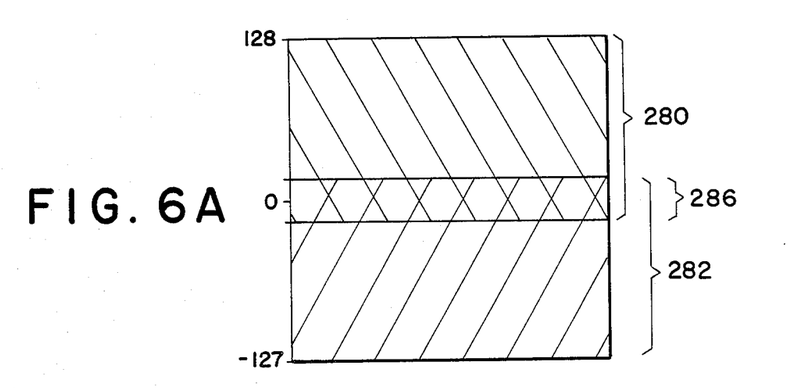
FIG. 6A is a graphic illustration of the primary and stimulated echo data sets collected with the sequence of FIG. 6; and, FIG. 7 illustrates an alternate embodiment to the sequence of FIG. 6 in which the phase encoding is removed after each echo.

With reference to FIG. 6A, the first and second magnetic resonance echo data sets 280, 282 have an interface 286 adjacent the central, specifically the zero phase encode view. More specifically, the two data sets have an overlap extending from about −23g to +24g. These 48 lines of redundant data are utilized by the normalizing means 28 and the comparing means 32 to derive the appropriate correction factors. This imaging sequence is advantageous in imagers that have significant eddy currents or other non-linearities which cause the primary and stimulated echo data to mismatched because it has only a single interface at which the two data sets must be matched. This embodiment is also less sensitive to artifacts. As illustrated in FIG. 6A, the regions 280 and 282 have a small area of overlap 286 adjacent a single interface around the 0g view. Of course, other pairings of the first and second gradient steps can be provided, for example, the appropriate gradient steps to define the first or primary echo data set and stimulated data set as illustrated in FIGS. 2A, 5A, or the like.

Figure 7:
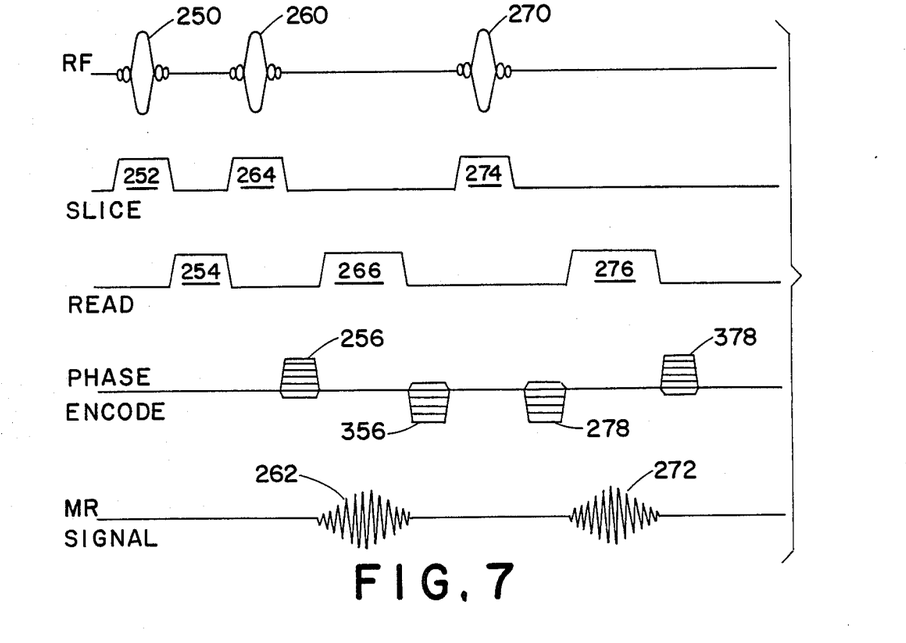

The sequence of FIG. 7 is essentially the same as the sequence of FIG. 6 except that the first and second phase encodings are removed after the primary and stimulated echoes, respectively. That is, a first additional phase encode gradient 356 which is equal and opposite to the first phase encode gradient 256 is applied subsequent to the primary echo to remove the phase encoding from the system. Analogously, a second additional phase encode gradient 378 is applied to remove the phase encoding of the second phase encode gradient 278 from the system. This eliminates the deleterious effects of incompletely rotating the phase encoded magnetization into and out of the transverse plane.

It is to be appreciated that the phase of the primary echo and the stimulated echoes are also affected by the phase of the RF pulses. The phase of the RF pulses as well as the phase of the phase encode pulses determine whether the alteration to the phase encoding is added or subtracted. Reversing either one causes a subtractive combination; reversing neither or both causes an additive combination.

Optionally, additional magnetization rotation pulses and slice select read and phase encode gradient pulses may be applied to cause third and subsequent stimulated echoes. Optionally, other relative phase encode angles among the primary and stimulated echoes may be selected. The phase angles from the primary and plural stimulated echoes may also be interleaved.

Although described in terms of 256 view images, it is to be appreciated that 512 or larger view images, as well as 128 and smaller view image, are contemplated. The embodiments of FIGS. 2–4, 6, and 7 can generate 512 views in the time required by the prior art to generate 256 views. Similarly, the FIG. 5 embodiment can generate 768 views in this same amount of time. Extending the FIG. 5 embodiment to a third stimulated echo would enable 1024 views to be collected in the same amount of time, or conversely, 256 views to be generated in a quarter of the prior art time. Analogously, quick pilot images of 128 views or less can be generated by the embodiments of FIGS. 2–4, 6, and 7 in a quarter of the time required by the prior art to generate 256 views. The embodiment of FIG. 5 can generate a 192 view pilot image in the same reduced time.

The invention has been described with reference to the preferred embodiments. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiment, the invention is now claimed to be:

1. A method of magnetic resonance imaging comprising:
   (a) exciting magnetic resonance in a subject;
   (b) inducing a primary echo with a first phase encoding and a stimulated echo with a second phase encoding, which second phase encoding is different from the first phase encoding;
   (c) collecting and summing primary and stimulated echo date;
   (d) repeating steps (a) through (c) for a plurality of phase encodings; and,
   (e) Fourier transforming the summed echo data to reconstruct a common image representation from the collected primary and stimulated echo data.

2. A method of magnetic resonance imaging comprising:
   (a) exciting magnetic resonance in a subject;
   (b) inducing a primary echo with a first phase encoding;
   (c) removing the first phase encoding after the primary echo and prior to inducing a stimulated echo;
   (d) inducing stimulated echo with a second phase encoding, which second phase encoding is different from the first phase encoding;
   (e) collecting primary and stimulated echo data;
   (f) repeating steps (a) through (c) for a plurality of phase encoding; and,
   (g) reconstructing a common image representation from the collected primary and stimulated echo data.

3. The method as set forth in claim 2 further including removing the second phase encoding subsequent to the stimulated echo.

4. A method of magnetic resonance imaging comprising:
   (a) exciting magnetic resonance in a subject;
   (b) inducing a primary echo with a first phase encoding and a stimulated echo with a second phase encoding, which second phase encoding is different from the first phase encoding;
   (c) collecting primary and stimulated echo data;
   (d) repeating steps (a) through (c) for a plurality of phase encodings in which the first phase encoding is varied in steps generally between a central phase encoding and a first maximum phase encoding and the second phase encoding is varied generally between the central phase encoding and a second maximum phase encoding, the first and second phase encodings being of opposite polarity, such that there is a single interface between the primary and stimulated echo data adjacent the central phase encoding; and,
   (e) reconstructing a common image representation from the collected primary and stimulated echo data.

5. The method as set forth in claim 4 further including phase encoding the primary echo with the second phase encoding steps and phase encoding the stimulated echo with the first phase encoding steps for a limited number of steps adjacent the central phase encoding such that redundant primary and stimulated echo data is generated adjacent the interface.

6. The method as set forth in claim 5 further including comparing the redundant data and adjusting at least one of the primary and stimulated echo data in accordance therewith.

7. A method of magnetic resonance imaging comprising:
   (a) exciting magnetic resonance in a subject;
   (b) inducing a primary echo with a first phase encoding and a stimulated echo with a second phase encoding, which second phase encoding is different from the first phase encoding;
   (c) collecting primary and stimulated echo data;
   (d) repeating steps (a) through (c) for a plurality of phase encodings such that there is at least one interface between the primary and stimulated echo data;
   (e) matching the primary and stimulated echo data adjacent the interface; and
   (f) reconstructing a common image representation from the collected primary and stimulated echo data.

8. A method of magnetic resonance imaging comprising:
   (a) applying a first radio frequency pulse to excite magnetic resonance;
   (b) applying a second radio frequency pulse to rotate a first component of the magnetic resonance into the transverse plane and inducing a primary magnetic resonance echo;
   (c) phase encoding the first component with a first phase encode angle;
   (d) applying at least a third ration frequency pulse to rotate the first magnetization component out of the transverse plane and rotate a second magnetization component into the transverse plane and inducing a stimulated magnetic response echo;
   (e) phase encoding the second magnetization component with a second phase encode angle which is different from the first phase encode angle;
   (f) collecting and summing primary and stimulated echo data during the primary and stimulated echoes;
   (g) repeating steps (a) through (f) for a plurality of first and second phase encode angles; and,
   (h) reconstructing a single image representation from the summed primary and stimulated echo data.

9. The method as set forth in claim 8 wherein the first phase encode gradient is repeated in steps from about a central phase encode angle to a first preselected phase encode angle and wherein the second phase encode gradient is applied in steps from about the central phase encode angle to a second preselected phase encode angle of an opposite polarity to the preselected phase encode angle, whereby a single interface occurs adjacent the central phase encode angle between the primary and stimulated echo data.

10. The method as set forth in claim 9 further including matching the primary and stimulated echo data along the interface.

11. The method as set forth in claim 10 further including collecting redundant primary and stimulated echo data adjacent the interface and wherein the matching step includes comparing the redundant primary and stimulated echo data and adjusting at least one of the primary and stimulated echo data in accordance with the comparison.

12. A method of magnetic resonance imaging comprising:
   (a) applying a first radio frequency pulse to excite magnetic resonance;
   (b) applying a second radio frequency pulse to rotate a first component of the magnetic resonance into the transverse plane and inducing a primary magnetic resonance echo;
   (c) phase encoding the first component with a first phase encode gradient;
   (d) applying a first additional phase encode gradient of equal magnitude and opposite polarity to the first phase encode gradient after the primary echo;
   (e) applying a third radio frequency pulse to rotate the first magnetization component out of the transverse plane and rotate a second magnetization component into the transverse plane inducing a stimulated magnetic response echo;
   (f) phase encoding the second magnetization component with a second phase encode gradient which is different from the first phase encode gradient;
   (g) applying a second additional phase encode gradient after the stimulated echo which has the same magnitude and opposite polarity as the second phase encode gradient;
   (h) collecting primary and stimulated echo data during the primary and stimulated echoes;
   (i) repeating steps (a) through (h) for a plurality of first and second phase encode angles; and,
   (j) reconstructing a single image representation from the summed primary and stimulated echo data.

13. A magnetic resonance imaging apparatus comprising:
   means for generating a generally uniform main magnetic field through an image region;
   a radio frequency means for selectively inducing magnetic resonance of selected dipoles of a subject in the examination region and for selectively causing primary and stimulated echoes;

a phase encoding means for phase encoding the primary and stimulated echoes with different phase angles;

a receiver means for receiving primary and stimulated echo data during the primary and stimulated echoes;

a correcting means for adjusting at least one of the primary and stimulated echo data to correct for discontinuities;

a transform means for transforming the aligned primary and stimulated echo data into an image representation.

* * * * *